United States Patent [19]
Sandhu

[11] Patent Number: 6,106,677
[45] Date of Patent: *Aug. 22, 2000

[54] METHOD OF CREATING LOW RESISTANCE CONTACTS IN HIGH ASPECT RATIO OPENINGS BY RESPUTTERING

[75] Inventor: Gurtej S. Sandhu, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/056,211

[22] Filed: Apr. 7, 1998

Related U.S. Application Data

[63] Continuation of application No. 08/642,612, May 3, 1996, abandoned.

[51] Int. Cl.[7] .................................................. C23C 14/34
[52] U.S. Cl. .................. 204/192.3; 204/192.12; 204/192.17; 204/192.32; 204/192.34; 427/97; 427/250; 438/639; 438/640; 438/680; 438/685; 438/686; 438/687; 438/688
[58] Field of Search .................... 204/192.12, 192.17, 204/192.3, 192.32, 192.34; 427/97, 250, 255.23, 255.394, 523, 524; 438/639, 640, 680, 685, 686, 687, 688

[56] References Cited

U.S. PATENT DOCUMENTS

| | | |
|---|---|---|
| 4,599,135 | 7/1986 | Tsunekawa et al. .................. 216/37 |
| 4,756,810 | 7/1988 | Lamont, Jr. et al. ................ 204/192.3 |
| 4,792,842 | 12/1988 | Honma et al. ........................ 257/763 |
| 4,874,493 | 10/1989 | Pan ...................................... 204/192.11 |
| 5,420,072 | 5/1995 | Fiordalice et al. ...................... 438/607 |
| 5,725,739 | 3/1998 | Hu ........................................ 204/192.3 |
| 5,730,835 | 3/1998 | Roberts et al. ........................ 257/773 |
| 5,985,103 | 11/1999 | Givens et al. ...................... 204/192.12 |

OTHER PUBLICATIONS

Homma et al., "Planar Deposition of Aluminum by RF/DC sputtering with RF bias", Journal of Electrochemical Society: Solid State Science and Technology, pp. 1466–1472, Jun. 1985.

Yoshio Homma and Sukeyoshi Tsunekawa; *Planar Deposition of Aluminum by RF/DC Sputtering with RF Bias*; Jun., 1985; 1466–1472; Kokubunji, Tokyo 185, Japan.

*Primary Examiner*—Rodney McDonald
*Attorney, Agent, or Firm*—Kirkpatrick & Lockhart LLP

[57] ABSTRACT

A method of producing a low resistance contact in an opening carried in a substrate is comprised of the steps of forming a first layer of conductive material along a portion of the walls of the opening. A portion of the conductive material is resputtered from the walls of the opening to form a thin layer at the bottom of the opening. A second layer of conductive material is deposited on the substrate in a manner to fill the opening. A contact thus formed is also disclosed.

31 Claims, 3 Drawing Sheets

METHOD OF CREATING LOW RESISTANCE CONTACTS IN HIGH ASPECT RATIO OPENINGS BY RESPUTTERING

CROSS-REFERENCE TO RELATED APPLICATIONS

This application is a continuation of U.S. patent application Ser. No. 08/642,612, filed May 3, 1996 now abandoned.

STATEMENT REGARDING FEDERALLY-SPONSORED RESEARCH OR DEVELOPMENT

Not Applicable.

BACKGROUND OF THE INVENTION

1. Field of the Invention

The present invention is directed to methods used in the fabrication of solid state devices and, more particularly, to methods of producing metal contacts.

2. Description of the Background

During the fabrication of solid state devices, it is necessary to use various types of interconnect structures such as contacts and vias. A via is an electrical connection between two metal layers and a contact is an electrical connection between anything other than two metal layers, such as between metal and silicon. Vias and contacts are used extensively in very large scale integrated (VLSI) circuits. An average VLSI circuit may contain 16 million vias and contacts.

It is desirable to completely fill vias and contact openings with metal or some other suitable electrically conductive material. However, when coating the surface of a substrate with a metal film by such processes as evaporation, ion beam deposition, or sputtering, self-shadowing may arise. Self-shadowing is a phenomena whereby the deposited material is deposited around the upper portion of a contact or via opening, restricting the diameter of the opening so that the bottom and lower portion are shadowed from the deposition process. Shadowing results in poor contact at the bottom of the opening, which results in high contact resistance, and the problems associated therewith, and can result in an open circuit. Another problem associated with shadowing is that with the contact opening pinched-off, debris, chemicals used in the fabrication process, or other foreign materials become trapped. When that occurs, the resulting contact has poor electrical properties and may ultimately fail. As circuit complexity rises, submicron contact openings result which have severe aspect ratios which exacerbate the aforementioned shadowing problems.

An attempt to solve the aforementioned problems is found in U.S. Pat. No. 4,874,493 entitled Method Of Deposition Of Metal Into Cavities On A Substrate. The method disclosed in that patent includes depositing a film of metal onto a flat surface and cavities in a substantially perpendicular direction to the surface. Simultaneously, the deposited film is resputtered from the flat surface by ion beam milling at an angle to the surface of the substrate for achieving the deposition of metal into the cavities and filling the cavities without leaving any film on the flat surface. A problem associated with the method of U.S. Pat. No. 4,874,493 is that processes such as ion beam milling and resputtering tend to be slow and inefficient. To completely fill a contact or via opening through resputtering or ion beam milling substantially reduces the throughput of equipment. At the same time, such processes require the use of larger amounts of metal or conductive material than are actually needed for filling the contact and via openings. Thus, the need exists for a method of preventing the aforementioned shadowing and debris trapping problems which is both an efficient use of equipment and material.

SUMMARY OF THE INVENTION

The present invention is directed to a method of producing a low resistance contact in an opening carried in a substrate. The method is comprised of the steps of forming a first layer of conductive material along a portion of the walls of the opening. A portion of the conductive material is resputtered from the walls near the top of the opening to the bottom and side walls of the opening. A second layer of conductive material is deposited on the substrate in a manner to substantially fill the opening.

The method of the present invention overcomes many of the shortcomings of the prior art. The resputtering step of the present invention is carried out only long enough to reduce the amount of material deposited around the top of the opening thereby reducing or eliminating problems resulting from shadowing and pinch-off. During the resputtering step, a thin layer of the material, which is electrically conductive, is formed at the bottom of the opening thereby insuring good electrical contact. The remainder of the opening is filled by a process other than resputtering, such as CVD, which is quicker and more efficient. During the CVD process, the conductive material being deposited does not suffer from shadowing effects because the resputtering step has removed excess material from the top of the opening. Also, because the resputtered material forms a thin layer at the bottom of the opening, good electrical conduct is established with the subsequently deposited conductive material thereby insuring the construction of an electrical contact having low resistance.

The present invention is also directed to an electrical contact formed in an opening in a substrate which is comprised of a first layer of conductive material positioned at the bottom of the opening through resputtering and a second layer of conductive material positioned on top of the first layer of conductive material through a process other than resputtering. The contact thus formed has good electrical properties and is less prone to failure. Such contacts can be formed economically in as much as the resputtering step is short in duration and requires that only a portion of the previously deposited conductive material be removed from the walls of the opening and positioned at the bottom of the opening. Thus, equipment and raw materials are efficiently used. Those advantages and benefits of the present invention, and others, will become apparent from the Description Of The Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
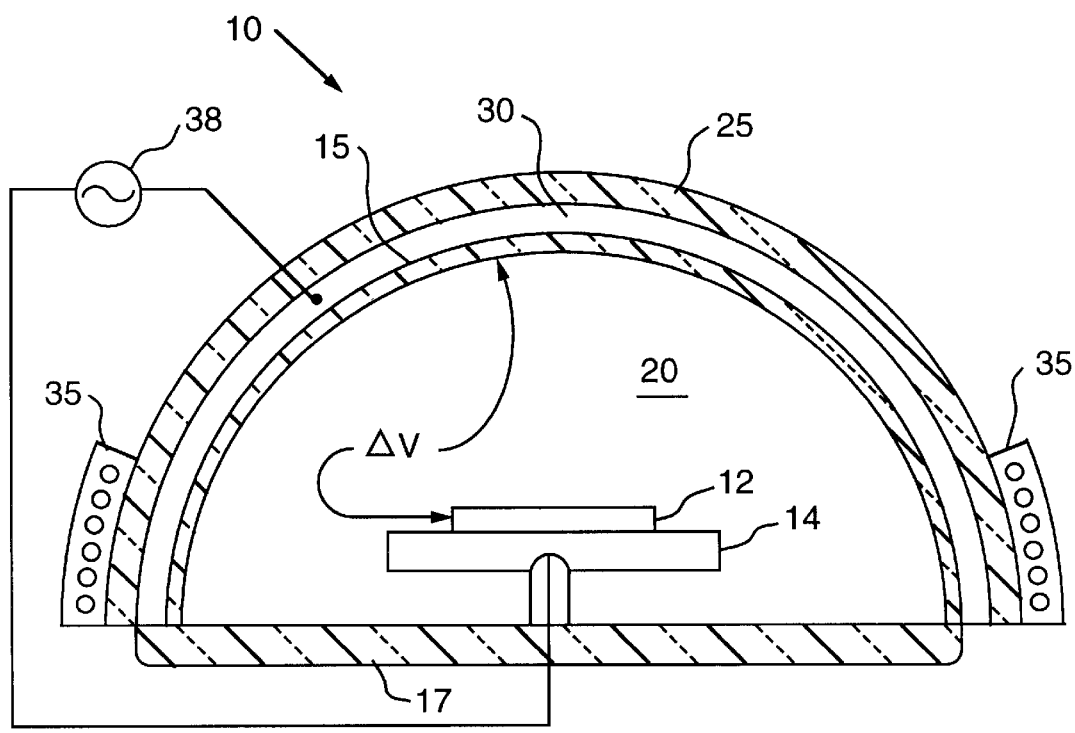
FIG. 1 illustrates one type of apparatus for carrying out the method of the present invention.

FIG. 1 illustrates one type of apparatus 10 which may be used to carry out the method of the present invention. In FIG. 1, a cross-sectional view of an inductively coupled plasma chamber is illustrated. A workpiece, typically a substrate 12, is supported on a pivotally mounted support member 14. Support member 14 may also be rotatable. An inner wall 15 extends from a base member 17, typically near a periphery of the base member 17, to form an enclosed chamber 20. An outer wall 25 is concentric to and distanced from the inner wall 15 such that a void 30 or gap exists between the inner 15 and outer 25 walls. The support member 14, the base 17, the inner wall 15, and the outer wall 25 are made from insulative materials. An inductor coil 35 is positioned exterior to the outer wall 25 and surrounding the outer wall 25. The inductor coil 35 may or may not be physically attached to the outer wall 25. During deposition or etching of the workpiece 12, deposition or etch gases are injected into the enclosed chamber 20 through means known in the art, which are not shown. The gases are inductively ionized by the inductor coil 35 when current flows through the inductor coil 35 from a source not shown.

A voltage source 38 may be used to create an electric field ($\Delta v$) within chamber 20, preferably between inner wall 15 and workpiece 12. The charged ions from the ionized gases will react with the electric field so as to bombard the workpiece 12. By pivoting the support member 14, the angle at which the workpiece 12 is bombarded may be varied from 90° to extremely low angles such as 30°. Finally, a honeycomb mask (not shown) may be positioned above or on top of the workpiece 12 to directionalize the plasma.

Figure 2:
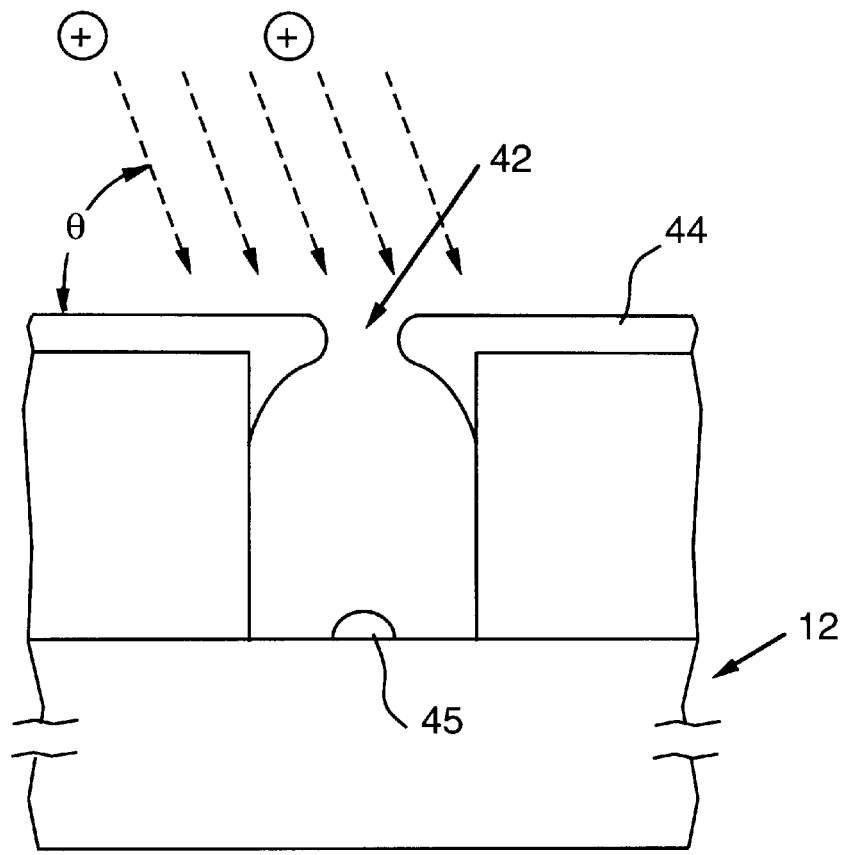
FIG. 2 illustrates a portion of a substrate upon which an opening has been formed.

FIG. 2 illustrates a portion of a substrate workpiece 12 after an opening 42 has been created. The opening 42 may be created in any known manner, and the process steps used to create opening 42 will depend upon the particular stage of fabrication. The opening 42 may be for either a via or a contact.

After the opening 42 is created, a layer of conductive material 44, which may be, for example, a metal such as titanium or a doped polysilicon, is deposited. As a result of the deposition, material builds up around the upper portion of the opening 42 thereby shadowing the bottom of the opening such that only a small amount 45 of the layer of conductive material 44 is deposited on the bottom of the opening 42.

According to the method of the present invention, the substrate 12 illustrated in FIG. 2 is now subjected to a resputtering step. That step may be performed in a highly directional noble gas plasma created in the apparatus 10 of FIG. 1. A directional gas plasma can be obtained by properly adjusting the sputtering parameters as well as through the use of a honeycomb mask (not shown). The angle $\theta$ between the surface of the wafer and the ions is preferably, but need not be, maintained at about 80° which translates into 10° for the walls of the opening 42. That not only helps protect the base of the opening 42 from ion bombardment, but also provides for the maximum sputtering yield. Sputtering yield is defined as the number of atoms ejected per incident ion. In general, the sputtering yield shows a maximum when ions bombard the surface at large oblique angles. The following table shows some examples of sputtering efficiency of argon and xenon for various metals.

TABLE I

Sputtering Yields of Ar and Xe for metals.

| Metal | Sputtering Yield | Ion |
| --- | --- | --- |
| Al | 2.0 | Ar(2keV) |
| Au | 5.6 | Ar(2keV) |
| Ti | 0.7 | Ar(1keV) |
| Cu | 4.3 | Ar(2keV) |
| Cu | 6.0 | Ar(5keV) |
| Cu | 9.0 | Xe(9keV) |

When angles $\theta$ other than 90° are used, it is desirable to rotate the workpiece 12 within the plasma.

Figure 3:
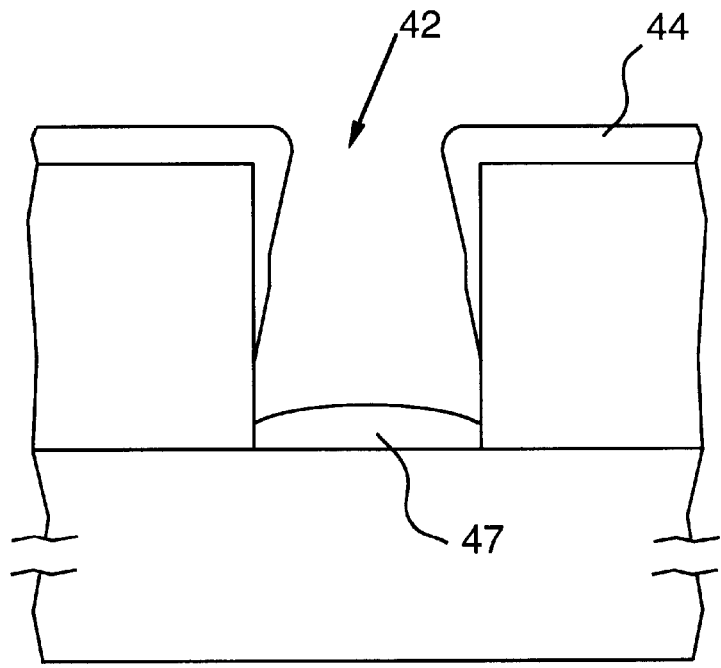
FIG. 3 illustrates the opening of FIG. 2 after a resputtering operation.

Turning to FIG. 3, FIG. 3 illustrates the opening 42 of FIG. 2 after the resputtering operation. As seen in FIG. 3, the portions of the layer 44 which tended to pinch-off opening 42 have been greatly reduced such that the layer 44 more gradually tapers down the side of the opening 42. Additionally, a portion of the resputtered material forms a thin layer 47 at the bottom of the opening 42. The thin layer 47 may be on the order of 100 angstroms.

Figure 4:
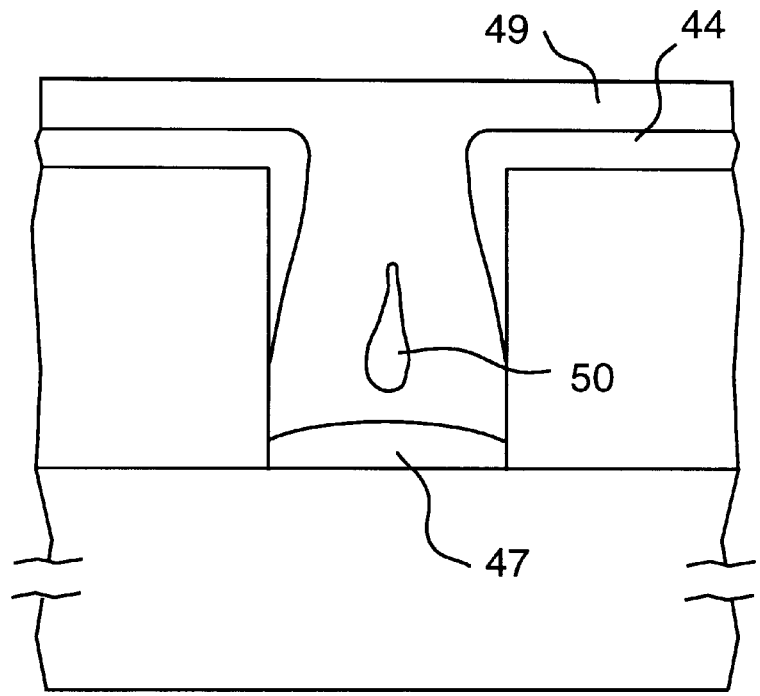
FIG. 4 illustrates the opening after a metal deposition step in accordance with the method of the present invention.
Figure 5:
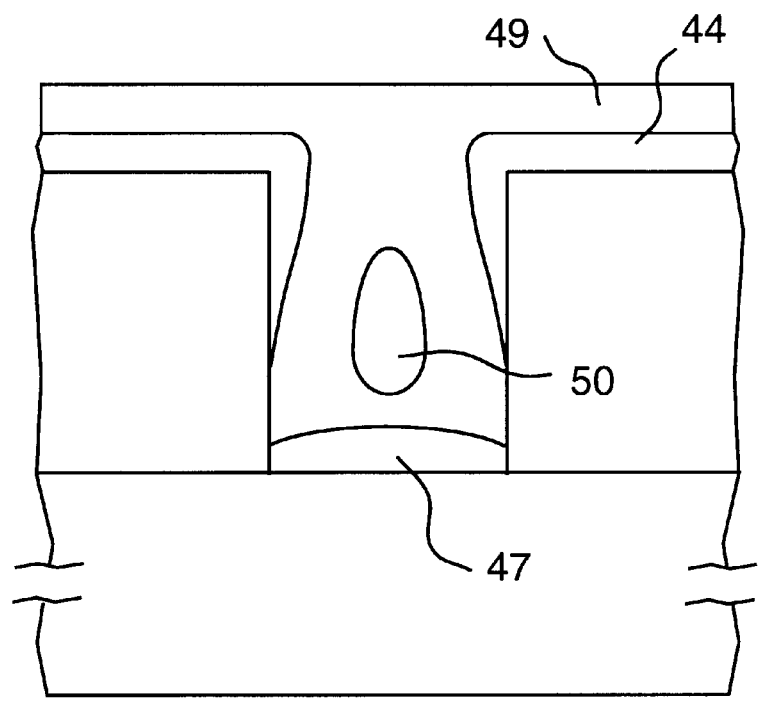
FIG. 5 illustrates the opening after a metal deposition step in accordance with the prior art.

In FIG. 4, the opening 42 illustrated in FIG. 3 is illustrated after a second conductive layer 49 has been deposited. Preferably, the second conductive layer 49 is deposited using a technique other than sputtering, such as chemical vapor deposition. While depositing the layer 49, a keyhole or void 50 may be formed. If the keyhole 50 illustrated in FIG. 4 was formed in conjunction with the opening 42 as illustrated in FIG. 2, the keyhole 50 would be larger as shown in FIG. 5 because of the pinched-off nature of the opening 42 such that the layer 49 would make extremely poor contact with the bottom of the opening 42. Thus, the resputtering step of the present invention enables the layer 49 to form a much better electrical contact, in a cost effective and efficient manner, than is capable with the prior art. After the layer 49 has been deposited as shown in FIG. 4, standard processing of the workpiece 12 may continue.

The present invention is also directed to a contact formed by the method of the present invention. A contact formed by the method of the present invention is characterized by two separate conductive layers. The first conductive layer, which is positioned at the bottom of the opening, and is also positioned around the periphery of the upper portion of the opening, is preferably the result of a resputtering step. The first conductive layer may, for example, include Al, Au, Ti and Cu. The second conductive material fills, or substantially fills, the remainder of the opening and is preferably deposited by some method other than resputtering. The second conductive material may, for example, include W. Contacts thus formed have lower resistance and are less likely to fail.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of producing a contact in an opening defined by walls in a substrate and a bottom, said method comprising the steps of:

depositing a first layer of conductive material along a portion of the walls of the opening and on a first portion of the bottom of the opening and to the exclusion of a second portion of the bottom of the opening;

sputtering a portion of the conductive material from the walls of the opening to the second portion of the bottom of the opening after completion of depositing the first layer of conductive material to reduce pinch-off; and depositing a second layer of conductive material by a process other than sputtering on the substrate in a manner to substantially fill the opening.

2. The method of claim 1 wherein said sputtering step includes sputtering material from the walls near the top of the opening.

3. The method of claim 1 wherein said sputtering step includes the step of sputtering conductive material to the bottom of the walls and the second portion of the bottom of the opening.

4. The method of claim 1 wherein said step of depositing a first layer of material includes the step of depositing a layer of metal by sputtering.

5. The method of claim 1 wherein said step of depositing a first layer of material includes the step of depositing a layer of metal by chemical vapor deposition.

6. The method of claim 1 wherein said step of sputtering includes the step of sputtering with a directional plasma.

7. The method of claim 6 additionally comprising the step of orienting the walls of the opening at an angle with respect to the directional plasma.

8. The method of claim 7 wherein said step of orienting the walls of the opening at an angle with respect to the directional plasma includes orienting the walls of the opening approximately ten degrees with respect to the directional plasma.

9. The method of claim 1 wherein said step of depositing a first layer of conductive material includes the step of depositing a layer of aluminum and wherein said sputtering step includes sputtering with an argon plasma.

10. The method of claim 1 wherein said step of depositing first layer of conductive material includes the step of depositing a layer of gold and wherein said sputtering step includes sputtering with an argon plasma.

11. The method of claim 1 wherein said step of depositing a first layer of conductive material includes the step of depositing a layer of titanium and wherein said sputtering step includes sputtering with an argon plasma.

12. The method of claim 1 wherein said step of depositing a first layer of conductive material includes the step of depositing a layer of copper and wherein said sputtering step includes sputtering with an argon plasma.

13. The method of claim 1 wherein said step of depositing a first layer of conductive material includes the step of depositing a layer of copper and wherein said sputtering step includes sputtering with a xenon plasma.

14. The method of claim 1 wherein said step of depositing a second layer of conductive material includes the step of depositing a second layer of material by chemical vapor deposition.

15. The method of claim 1 wherein said step of depositing a first layer of conductive material includes the step of depositing a layer of aluminum and wherein said step of depositing a second layer of material includes the step of depositing a layer of tungsten.

16. The method of claim 1 wherein said step of depositing a first layer of conductive material includes the step of depositing a layer of gold and wherein said step of depositing a second layer of material includes the step of depositing a layer of tungsten.

17. The method of claim 1 wherein said step of depositing a first layer of conductive material includes the step of depositing a layer of titanium and wherein said step of depositing a second layer of material includes the step of depositing a layer of tungsten.

18. The method of claim 1 wherein said step of depositing a first layer of conductive material includes the step of depositing a layer of copper and wherein said step of depositing a second layer of material includes the step of depositing a layer of tungsten.

19. A method of producing a contact in an opening defined by walls in a substrate and a bottom, said method comprising the steps of:

depositing a layer of conductive material on an upper surface of the substrate and along a portion of the walls of the opening and on a first portion of the bottom of the opening and to the exclusion of a second portion of the bottom of the opening;

directionalizing an ion beam;

orienting the walls of the opening with respect to the directionalized ion beam;

sputtering a portion of the conductive material with the ion beam from the walls of the opening to the second portion of the bottom of the opening after completion of depositing the layer of conductive material to reduce pinch-off such that conductive material remains on the upper surface of the substrate; and depositing a layer of metal on the substrate by a process other than sputtering in a manner to substantially fill the opening.

20. The method of claim 19 wherein said sputtering step includes the step of sputtering conductive material from the walls near the top of the opening.

21. The method of claim 19 wherein said sputtering step includes the step of sputtering conductive material to the bottom of the walls and the second portion of the bottom of the opening.

22. The method of claim 19 wherein said step of orienting the walls of the opening at an angle with respect to the directional ion beam includes orienting the walls of the opening approximately ten degrees with respect to the directional ion beam.

23. The method of claim 19 wherein said step of depositing a layer of conductive material includes the step of depositing a layer of aluminum and wherein said sputtering step includes sputtering with an argon ion beam.

24. The method of claim 19 wherein said step of depositing a layer of conductive material includes the step of depositing a layer of gold and wherein said sputtering step includes sputtering with an argon ion beam.

25. The method of claim 19 wherein said step of depositing a layer of conductive material includes the step of depositing a layer of titanium and wherein said sputtering step includes sputtering with an argon ion beam.

26. The method of claim 19 wherein said step of depositing a layer of conductive material includes the step of depositing a layer of copper and wherein said sputtering step includes sputtering with an argon ion beam.

27. The method of claim 19 wherein said step of depositing a layer of conductive material includes the step of depositing a layer of copper and wherein said sputtering step includes sputtering with a xenon ion beam.

28. The method of claim 19 wherein said step of depositing a layer of conductive material includes the step of depositing a layer of aluminum and wherein said step of depositing a layer of metal includes the step of depositing a layer of tungsten.

29. The method of claim 19 wherein said step of depositing a layer of conductive material includes the step of depositing a layer of gold and wherein said step of depositing a layer of metal includes the step of depositing a layer of tungsten.

30. The method of claim 19 wherein said step of depositing a layer of conductive material includes the step of depositing a layer of titanium and wherein said step of depositing a layer of metal includes the step of depositing a layer of tungsten.

31. The method of claim 19 wherein said step of depositing a layer of conductive material includes the step of depositing a layer of copper and wherein said step of depositing a layer of metal includes the step of depositing a layer of tungsten.

* * * * *

UNITED STATES PATENT AND TRADEMARK OFFICE
CERTIFICATE OF CORRECTION

PATENT NO. : 6,106,677  
DATED : August 22, 2000  
INVENTOR(S) : Sandhu

Page 1 of 1

It is certified that error appears in the above-identified patent and that said Letters Patent is hereby corrected as shown below:

Column 5,  
Line 15, after the words "first layer of", please insert the word -- conductive -- immediately thereafter.  
Line 18, after the words "first layer of", please insert the word -- conductive -- immediately thereafter.

Signed and Sealed this

Thirtieth Day of October, 2001

*Attest:*

NICHOLAS P. GODICI  
*Attesting Officer*  *Acting Director of the United States Patent and Trademark Office*